(12) United States Patent
Kris

(10) Patent No.: US 7,502,436 B2
(45) Date of Patent: Mar. 10, 2009

(54) APPARATUS AND METHOD FOR GENERATING PUSH-PULL PULSE WIDTH MODULATION SIGNALS

(75) Inventor: Bryan Kris, Phoenix, AZ (US)

(73) Assignee: Microchip Technology Incorporated, Chandler, AZ (US)

(*) Notice: Subject to any disclaimer, the term of this patent is extended or adjusted under 35 U.S.C. 154(b) by 0 days.

(21) Appl. No.: 12/049,424

(22) Filed: Mar. 17, 2008

(65) Prior Publication Data
US 2008/0159381 A1    Jul. 3, 2008

Related U.S. Application Data

(62) Division of application No. 10/986,255, filed on Nov. 10, 2004, now Pat. No. 7,376,182.

(60) Provisional application No. 60/603,718, filed on Aug. 23, 2004.

(51) Int. Cl.
*H03D 3/24* (2006.01)
*H03M 5/08* (2006.01)

(52) U.S. Cl. ................ 375/376; 375/354; 363/41; 341/53

(58) Field of Classification Search ............ 375/354, 375/376; 363/41; 341/53
See application file for complete search history.

(56) References Cited

U.S. PATENT DOCUMENTS

| | | | | |
|---|---|---|---|---|
| 5,070,312 A * | 12/1991 | Cho | ........................... | 332/109 |
| 5,202,725 A * | 4/1993 | Oku | ........................... | 355/69 |
| 5,231,363 A * | 7/1993 | Sano et al. | ........................... | 332/109 |
| 5,298,871 A * | 3/1994 | Shimohara | ........................... | 332/109 |
| 5,377,346 A * | 12/1994 | Williams | ........................... | 713/502 |
| 5,404,116 A * | 4/1995 | Ichihara | ........................... | 332/109 |
| 5,428,321 A * | 6/1995 | Yoshida et al. | ........................... | 332/109 |
| 5,428,639 A * | 6/1995 | Orbach et al. | ........................... | 375/238 |
| 5,471,635 A * | 11/1995 | Williams | ........................... | 713/500 |
| 5,485,487 A * | 1/1996 | Orbach et al. | ........................... | 375/238 |
| 5,675,297 A * | 10/1997 | Gose et al. | ........................... | 332/109 |
| 5,945,820 A * | 8/1999 | Namgoong et al. | ........................... | 323/282 |
| 6,023,199 A * | 2/2000 | Cheung | ........................... | 332/109 |
| 6,023,741 A * | 2/2000 | Yoshino | ........................... | 710/100 |
| 6,124,757 A * | 9/2000 | Newey | ........................... | 330/10 |
| 6,157,671 A | 12/2000 | Young | ........................... | 375/238 |
| 6,414,858 B1 * | 7/2002 | Giannopoulos | ........................... | 363/41 |

(Continued)

FOREIGN PATENT DOCUMENTS

EP    0910168    9/1998

*Primary Examiner*—Chieh M Fan
*Assistant Examiner*—Jason M. Perilla
(74) *Attorney, Agent, or Firm*—Baker Botts L.L.P.

(57) ABSTRACT

A pulse width modulation (PWM) generator featuring very high speed and high resolution capability and the ability to generate standard complementary PWM, push-pull PWM, variable offset PWM, multiphase PWM, current limit PWM, current reset PWM, and independent time base PWM while further providing automatic triggering for an analog-to-digital conversion (ADC) module that is precisely timed relative to the PWM signals. Applications include control of a switching power supply that requires very high speed operation to obtain high resolution at high switching frequencies, and the ability to vary the phase relationships among the PWM output signals driving the power supply power components. A single PWM duty cycle register may be used for updating any and/or all PWM generators at once to reduce the workload of a digital processor as compared to updating multiple duty cycle registers.

2 Claims, 16 Drawing Sheets

Standard PWM Circuit

U.S. PATENT DOCUMENTS

| | | | | |
|---|---|---|---|---|
| 6,421,382 B1* | 7/2002 | Hayakawa | ................... | 375/238 |
| 6,448,827 B1* | 9/2002 | Tojima | ....................... | 327/172 |
| 6,545,882 B2* | 4/2003 | Yang | ........................ | 363/21.08 |
| 6,597,735 B1* | 7/2003 | Baba | ......................... | 375/238 |
| 6,870,142 B2* | 3/2005 | Hada et al. | ................... | 219/494 |
| 6,937,084 B2* | 8/2005 | Bowling | ..................... | 327/393 |
| 6,946,984 B2* | 9/2005 | Rubin et al. | ................. | 341/141 |
| 6,947,493 B2* | 9/2005 | Cohen et al. | ................. | 375/295 |
| 6,979,987 B2* | 12/2005 | Kernahan et al. | ............ | 323/283 |
| 6,998,928 B2* | 2/2006 | Stengel et al. | ............... | 332/109 |
| 7,092,265 B2* | 8/2006 | Kernahan | ..................... | 363/65 |
| 7,151,521 B2* | 12/2006 | Willis et al. | ................... | 345/99 |
| 7,161,319 B2* | 1/2007 | Ergun et al. | ................. | 318/445 |
| 7,177,166 B1* | 2/2007 | Kris | .......................... | 363/41 |
| 7,288,916 B2* | 10/2007 | Mitsuki | ...................... | 318/723 |
| 7,391,280 B2* | 6/2008 | Hsu | ........................... | 332/109 |
| 2002/0136290 A1* | 9/2002 | Houghton | ................... | 375/238 |
| 2002/0179443 A1* | 12/2002 | Hada et al. | .................. | 204/408 |
| 2003/0156636 A1* | 8/2003 | Klemish et al. | ............. | 375/238 |
| 2003/0173946 A1* | 9/2003 | Liu et al. | .................... | 324/107 |
| 2004/0095119 A1* | 5/2004 | Kernahan et al. | ............ | 323/282 |
| 2004/0095164 A1* | 5/2004 | Kernahan et al. | ............. | 327/94 |
| 2004/0095264 A1* | 5/2004 | Thomas | ....................... | 341/53 |
| 2004/0095266 A1* | 5/2004 | Kernahan et al. | ........... | 341/165 |
| 2004/0135560 A1* | 7/2004 | Kernahan et al. | ........... | 323/282 |
| 2004/0155771 A1* | 8/2004 | Ergun et al. | ................. | 340/531 |
| 2004/0189582 A1* | 9/2004 | Willis et al. | ................... | 345/99 |
| 2004/0217860 A1* | 11/2004 | Ergun et al. | ................. | 340/540 |
| 2004/0222866 A1* | 11/2004 | Stengel et al. | ............... | 332/109 |
| 2004/0240540 A1* | 12/2004 | Matsushima | ................ | 375/238 |
| 2005/0077976 A1* | 4/2005 | Cohen et al. | ................. | 332/112 |
| 2005/0099217 A1* | 5/2005 | Agarwal | ..................... | 327/175 |
| 2005/0180499 A1* | 8/2005 | Hsu | .......................... | 375/238 |
| 2005/0184778 A1* | 8/2005 | Figoli | ......................... | 327/172 |
| 2005/0212577 A1* | 9/2005 | Madni et al. | ................ | 327/175 |
| 2005/0275568 A1* | 12/2005 | Madni et al. | .................. | 341/50 |

* cited by examiner

US 7,502,436 B2

APPARATUS AND METHOD FOR GENERATING PUSH-PULL PULSE WIDTH MODULATION SIGNALS

RELATED PATENT APPLICATION

This is a divisional application of and claims priority to commonly owned U.S. patent application Ser. No. 10/986,255; filed Nov. 10, 2004 now U.S. Pat No. 7,376,182; entitled "Digital Processor With Pulse Width Modulation Module Having Dynamically Adjustable Phase Offset Capability, High Speed Operation and Simultaneous Update of Multiple Pulse Width Modulation Duty Cycle Resisters," by Bryan Kris; and U.S. Provisional Patent Application Ser. No. 60/603,718; filed Aug. 23, 2004; both of which are hereby incorporated by reference herein for all purposes.

TECHNICAL FIELD OF THE INVENTION

The present invention relates to digital processors having digital pulse width modulation (PWM) capabilities, and more particularly, to a digital processor with a pulse width modulation module having dynamically adjustable phase offset capability, high speed operation and simultaneous update of multiple pulse width modulation duty cycle registers.

BACKGROUND OF THE RELATED TECHNOLOGY

No digital or analog pulse width modulation (PWM) generating device currently has the capability to vary the PWM phase offset while the PWM generating device is in operation. Existing digital PWM generating devices that are integrated with a microcontroller are designed to address technical requirements in the motor control industry.

In existing analog PWM generation devices, the phase relationship among the PWM output signals is fixed by design. Vendors produce devices for two, three or four phase outputs where the phase relationship among the outputs is evenly spread throughout the PWM cycle. A digital PWM module 1304 with a capability to offset the phase of the PWM signals is implemented in the Motorola MC68HC08SR12 and MC68HC908SR12 devices, but these devices can not vary the phase relations among the PWM outputs while the PWM generator is operational. U.S. Pat. No. 6,525,501, issued Feb. 25, 2003, describes a method for implementing multiple simultaneous duty cycle register updates.

There is, therefore, a need in the art for dynamically updateable PWM phase offset capability required for new power supply applications including format modes, phase shifting capability, multiple simultaneous PWM duty cycle register updating, and advanced analog-to-digital converter (ADC) trigger timing capabilities.

SUMMARY OF THE INVENTION

The invention overcomes the above-identified problems as well as other shortcomings and deficiencies of existing technologies by providing a digital PWM generation module (device) that is integrated (attached) with a digital processor, e.g., microprocessor, microcontroller, digital signal processor and the like, with features that would be useful for operation and control of advanced power supply systems.

The present invention comprises a PWM generator that features very high speed and high resolution capability and also includes the capability to generate standard complementary PWM, push-pull PWM, variable offset PWM, multiphase PWM, current limit PWM, current reset PWM, and independent time base PWM while further providing automatic triggering for an ADC module that is precisely timed relative to the PWM signals.

These features are especially advantageous in the control of a power supply requiring very high speed operation to obtain high resolution at high switching frequencies, and the ability to vary the phase relationships among the PWM output signals driving the power supply power components.

An additional feature of the present invention enables a digital processor access to a single PWM duty cycle register for updating any and/or all PWM generators at once to reduce the workload of the digital processor as compared to updating multiple duty cycle registers.

According to specific exemplary embodiments, dynamically updateable phase offset PWM generation may be implemented as follows, for example, in one of two ways: (1) The PWM generation module may use a digital adder module to add an offset to the PWM period counter. This counter and adder combination provides the time base for the offset PWM signal generation. An adder module is used that has an unique mechanism to handle the "roll-over" situation without requiring extra comparator logic. (2) The PWM generation module may use multiple counter modules to create offset PWM signals, the offset PWM signals are generated by initializing each of the multiple PWM counters to values specified by the user. A module provides synchronization of the counter modules among the PWM generators.

To provide operation at very high speeds, the PWM counter module employs a novel counter module. In order to reduce the workload of the digital processor when updating multiple PWM generators with new duty cycle information, multiple multiplexers are used to route the duty cycle values from a Master Duty Cycle (MDC) register to all of the PWM generators. Each PWM generator may selectively use its own PWM Duty Cycle (PDC) register or the data from the common MDC register. Therefore a single register access by the digital processor may be advantageously applied to multiple PWM generators.

Other technical features and advantages will be apparent from the following description of the specific exemplary embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawings wherein.

Figure 1A:
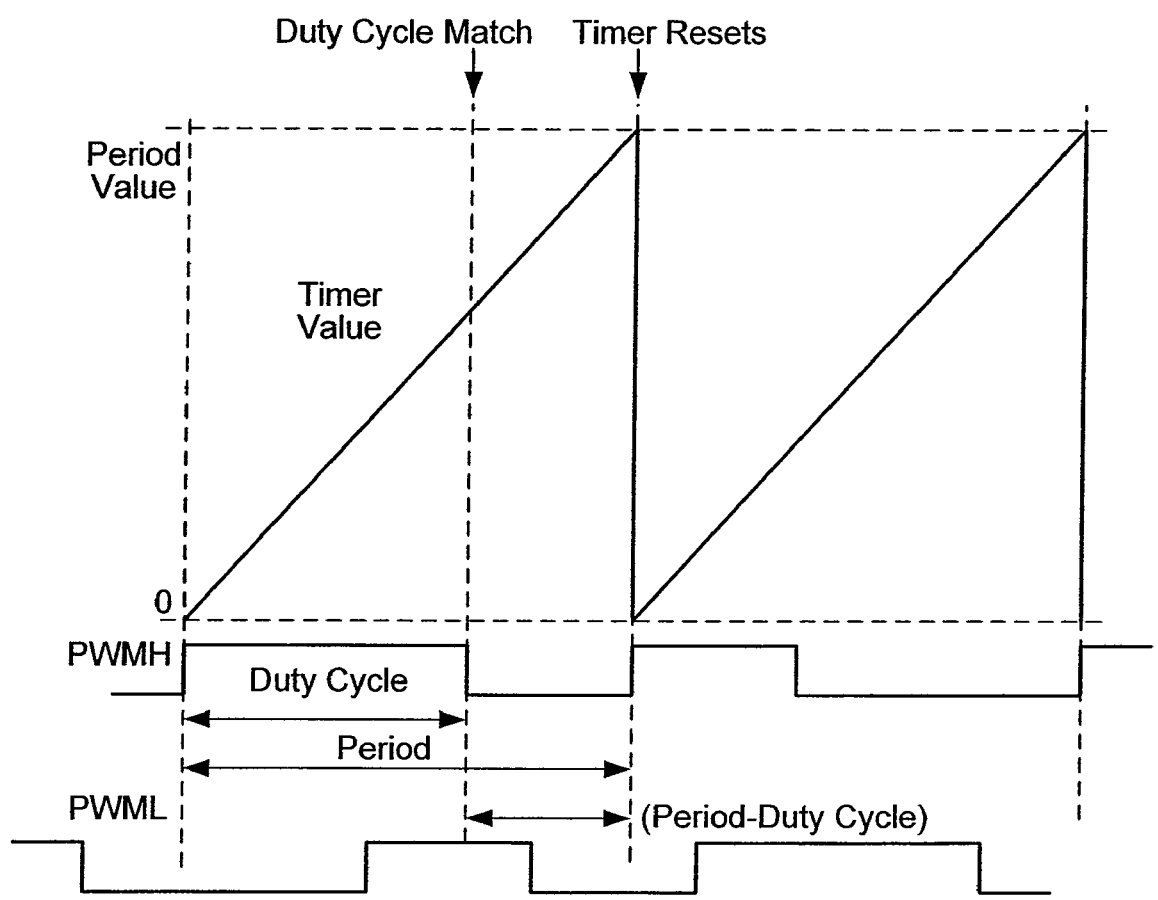
FIGS. 1*a*-1*g* illustrate timing diagrams of various PWM signal formats used in power conversion applications.
Figure 1B:
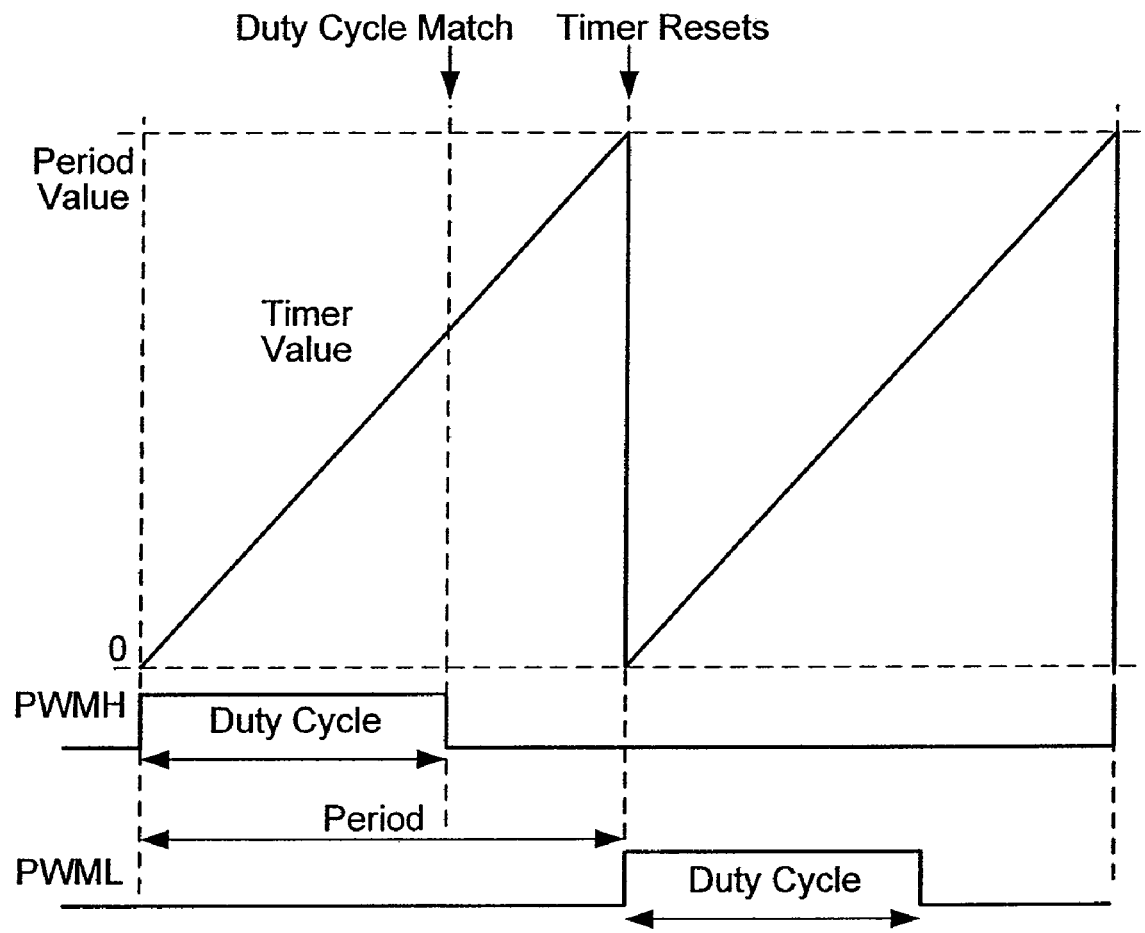
Figure 1C:
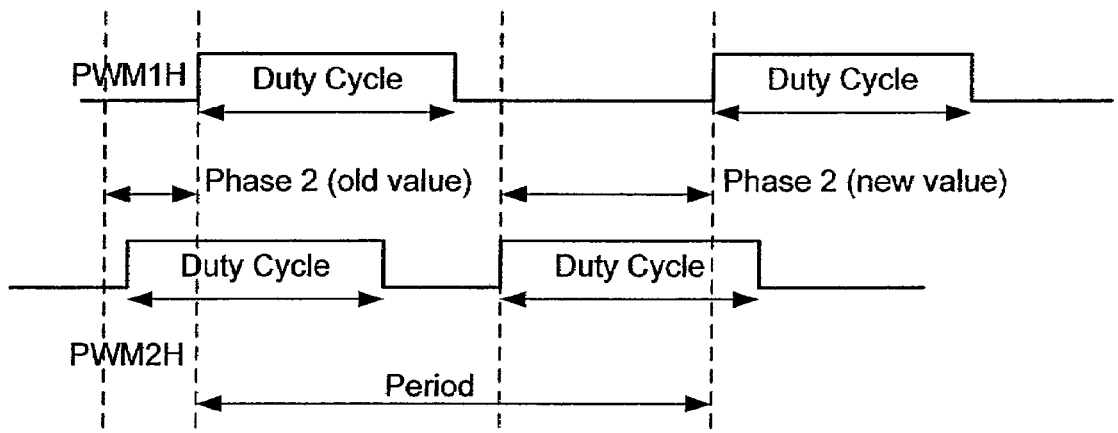
Figure 1D:
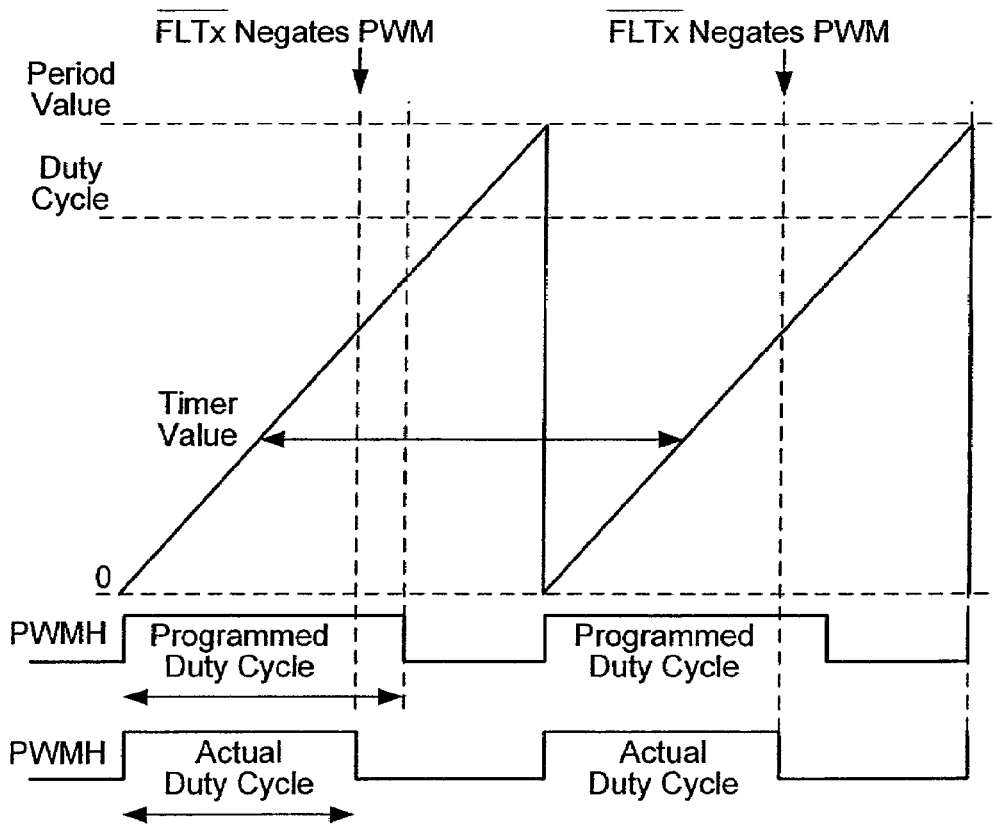
Figure 1E:
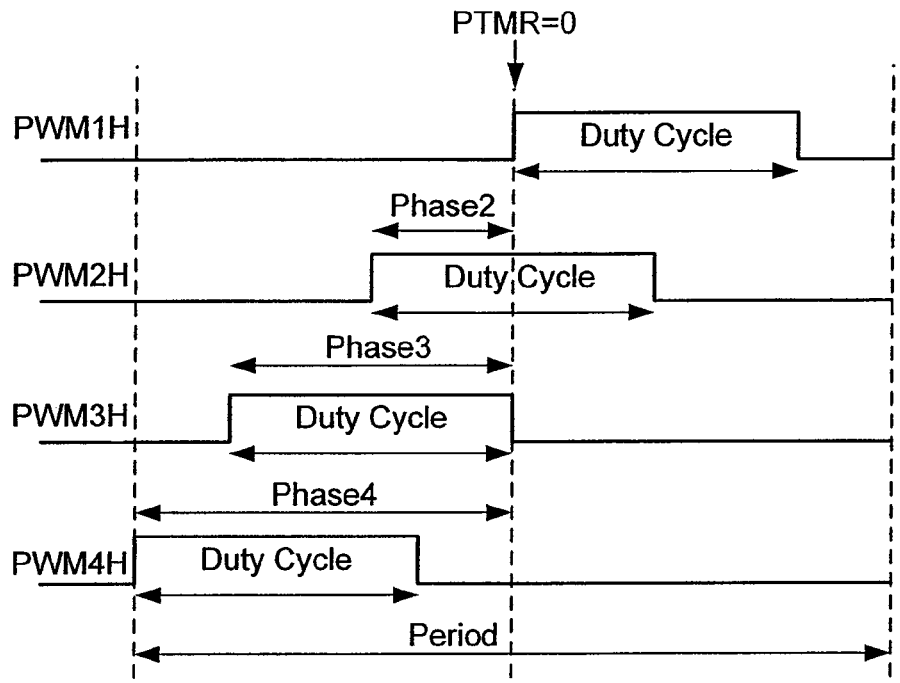

The present invention may be susceptible to various modifications and alternative forms. Specific embodiments of the present invention are illustrated by way of example in the drawings and are described herein in detail. It should be understood, however, that the description set forth herein of specific embodiments is not intended to limit the present invention to the particular forms disclosed. Rather, all modifications, alternatives, and equivalents falling within the spirit and scope of the invention as defined by the appended claims are intended to be covered.

DETAILED DESCRIPTION OF SPECIFIC EMBODIMENTS

Referring now to the drawings, the details of exemplary embodiments of the present invention are schematically illustrated. Like elements in the drawings will be represented by like numbers, and similar elements will be represented by like numbers with a different lower case letter suffix.

Figure 6:
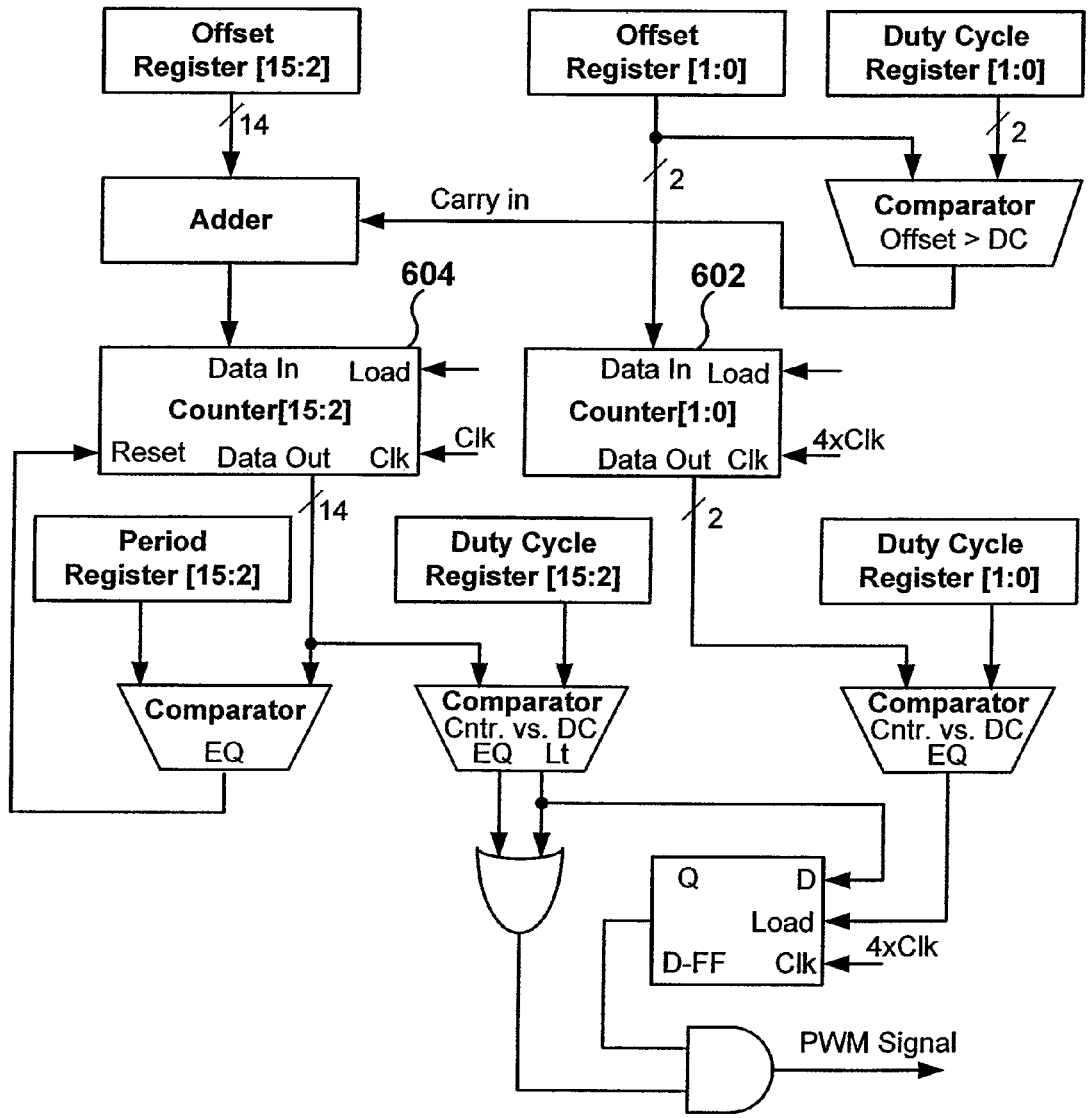
FIG. 6 illustrates a schematic block diagram of a specific exemplary embodiment of a high speed timer/counter for generating PWM.
Figure 7:
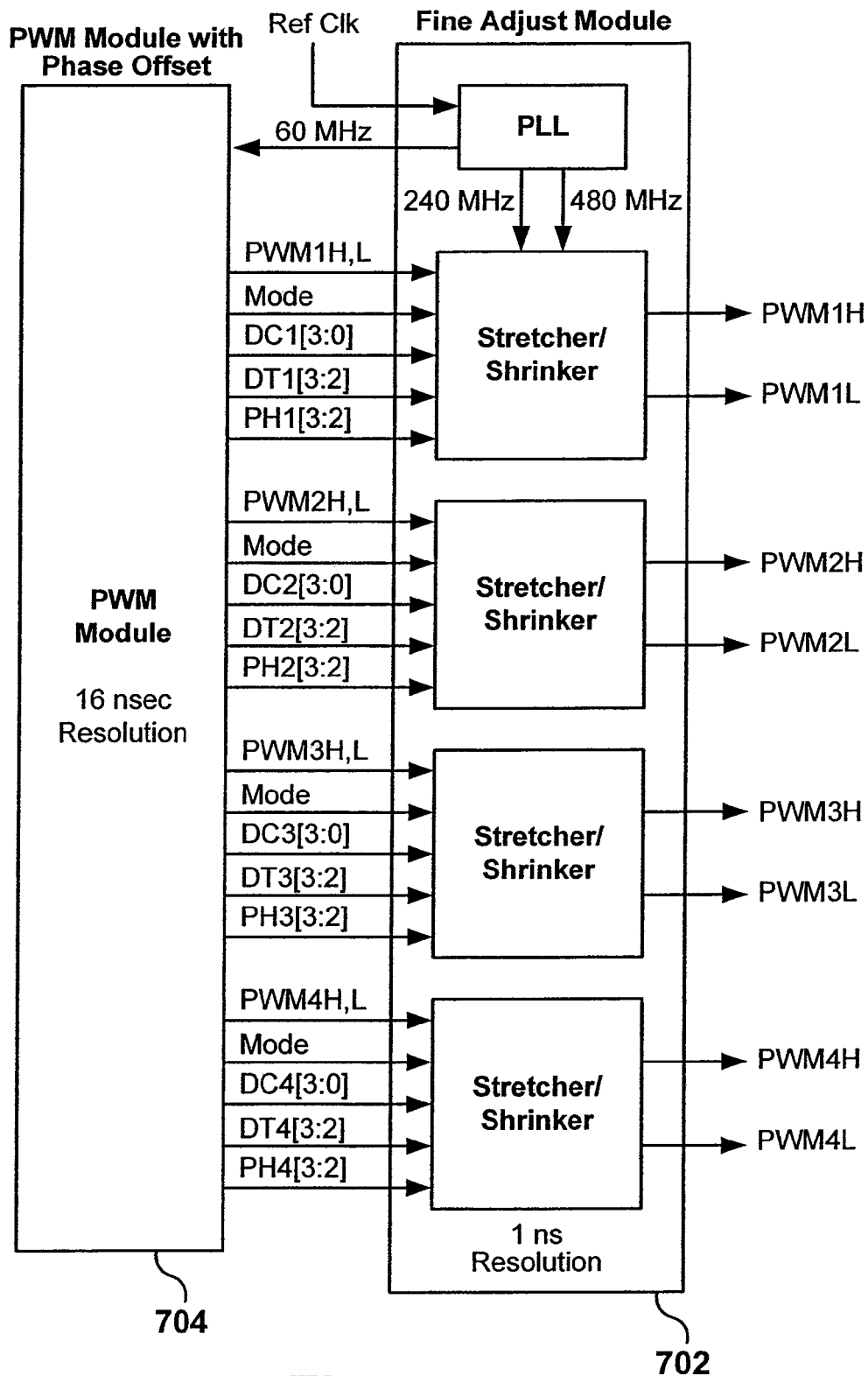
FIG. 7 illustrates a schematic block diagram of a specific exemplary embodiment of a fine adjustment module for improving the resolution of a PWM signal from the PWM generator.
Figure 8:
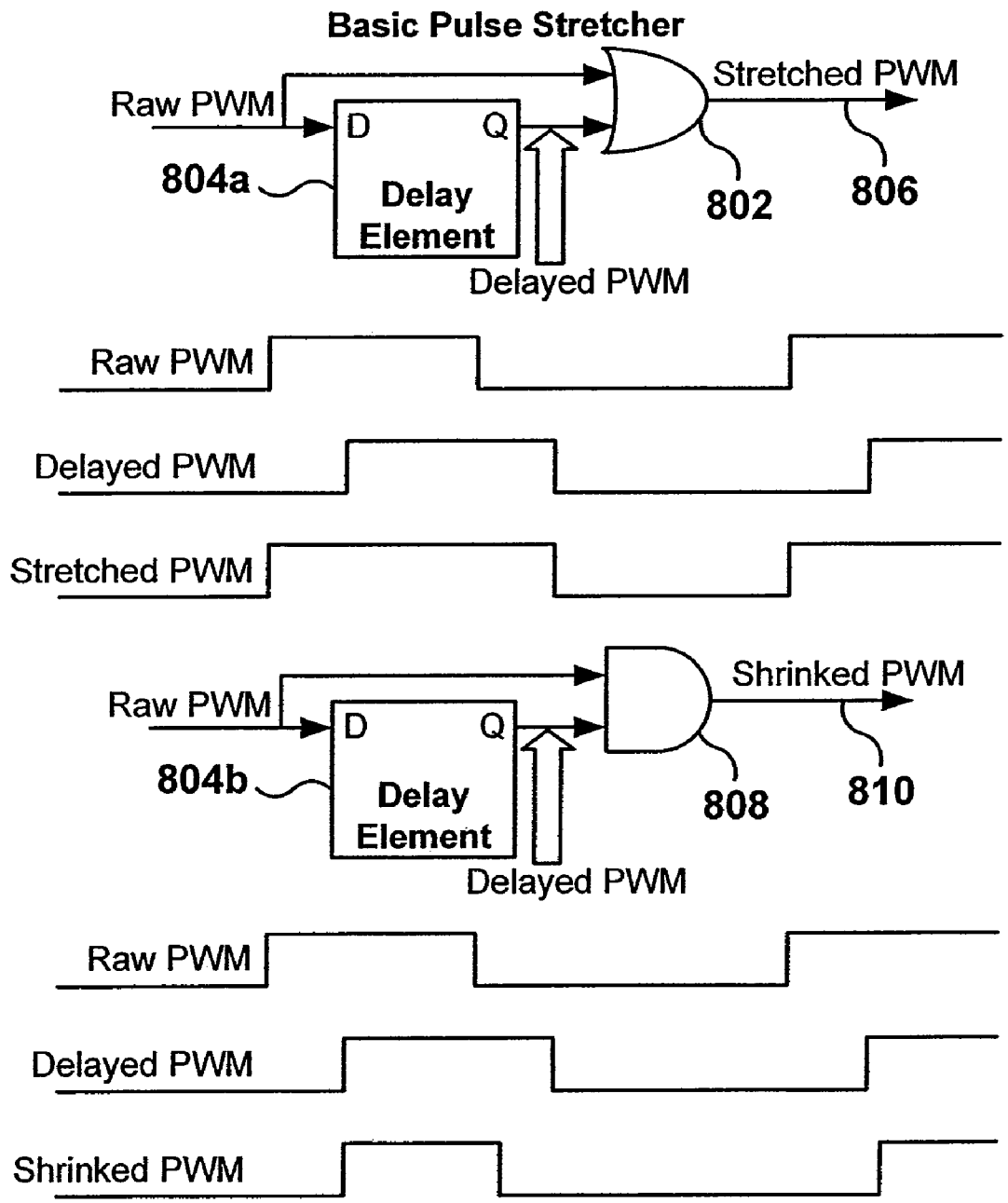
FIG. 8 illustrates schematic and timing diagrams of specific exemplary embodiments of a PWM stretcher and a PWM shrinker.
Figure 9:
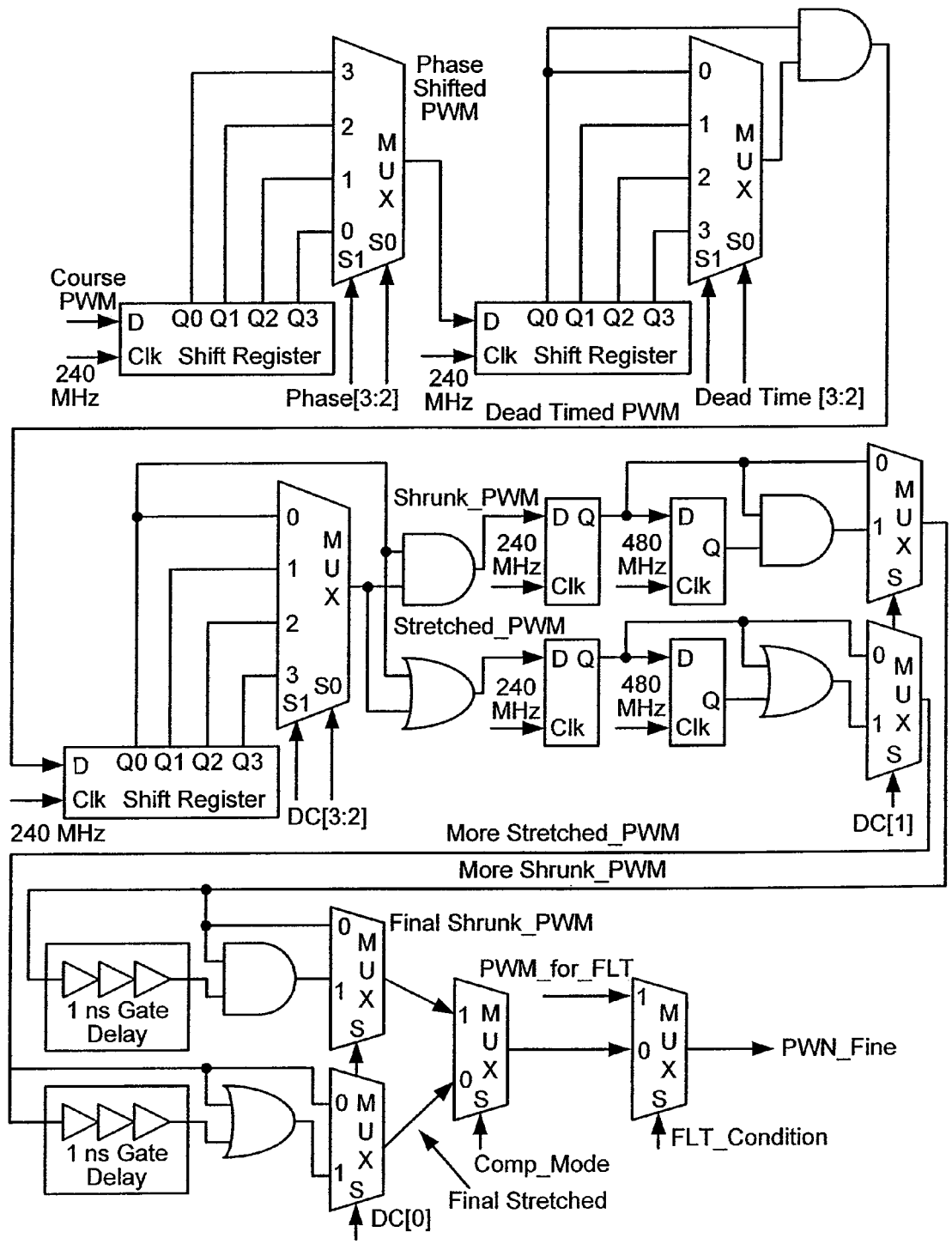
FIG. 9 illustrates a schematic block diagram of a specific exemplary embodiment of a circuit for improving resolution for phase offset, dead-time and duty cycle of a PWM signal.

Power supply designs require PWM signal formats that match the module topology of the power conversion (application) module. These PWM mode signal formats are illustrated in FIGS. 1a-1g as follows:

FIG. 1a: Standard Complementary mode PWM
FIG. 1b: Push-Pull mode PWM
FIG. 1c: Multi-Phase mode PWM
FIG. 1d: Variable Phase Offset mode PWM
FIG. 1e: Current Limit mode PWM
FIG. 1f: Current Reset Mode PWM
FIG. 1g: Independent Time base mode PWM Power supply applications require high duty cycle resolution while providing high frequency PWM switching. According to specific exemplary embodiments of the present invention, a new, novel and non-obvious PWM generator design provides up to 16 times the resolution versus speed capability of any known PWM generator technology product. Specific exemplary embodiments disclosed herein can provide high resolution of high frequency PWM switching signals. A specific exemplary embodiment is illustrated in FIG. 6, and another specific exemplary embodiment is illustrated in FIGS. 7-9.

Figure 13:
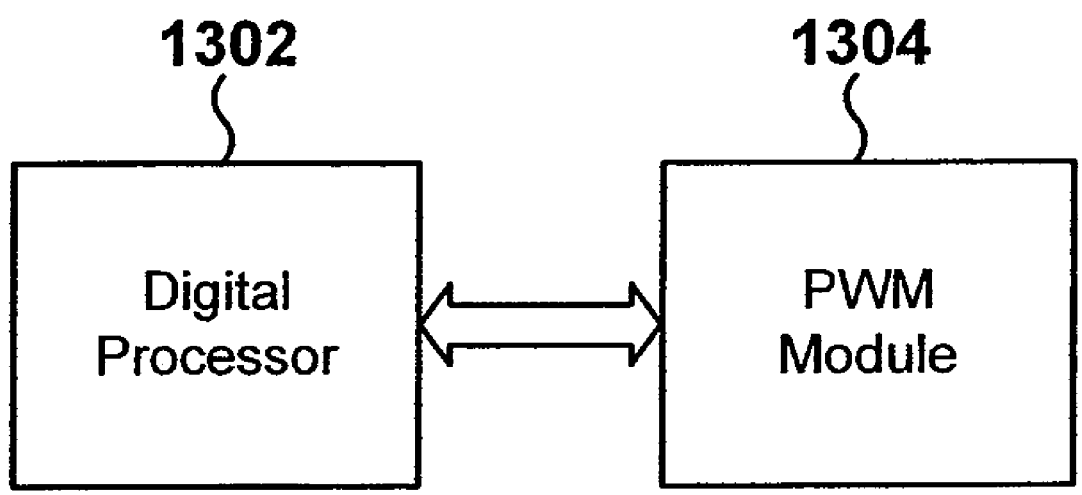
FIG. 13 illustrates a digital processor with a pulse width modulation module having dynamically adjustable phase offset capability, high speed operation and simultaneous update of multiple pulse width modulation duty cycle registers.

Referring to FIG. 13, depicted is a digital processor with a pulse width modulation module having dynamically adjustable phase offset capability, high speed operation and simultaneous update of multiple pulse width modulation duty cycle registers. The digital processor 1302 may be, for example but not limited to, a microprocessor, a microcontroller, a digital signal processor (DSP), an application specific integrated circuit (ASIC), a programmable logic array (PLA), and the like. The pulse width modulation (PWM) module 1304 may be coupled to the digital processor 1302 and may be packaged in the same integrated circuit package as is the digital processor 1302. The digital processor 1302 and PWM module 1304 may be fabricated on the same integrated circuit die (not shown) or may be fabricated on different integrated circuit dice and packaged together in one integrated circuit package, or they may be packaged in separate integrated circuit packages.

Figure 2:
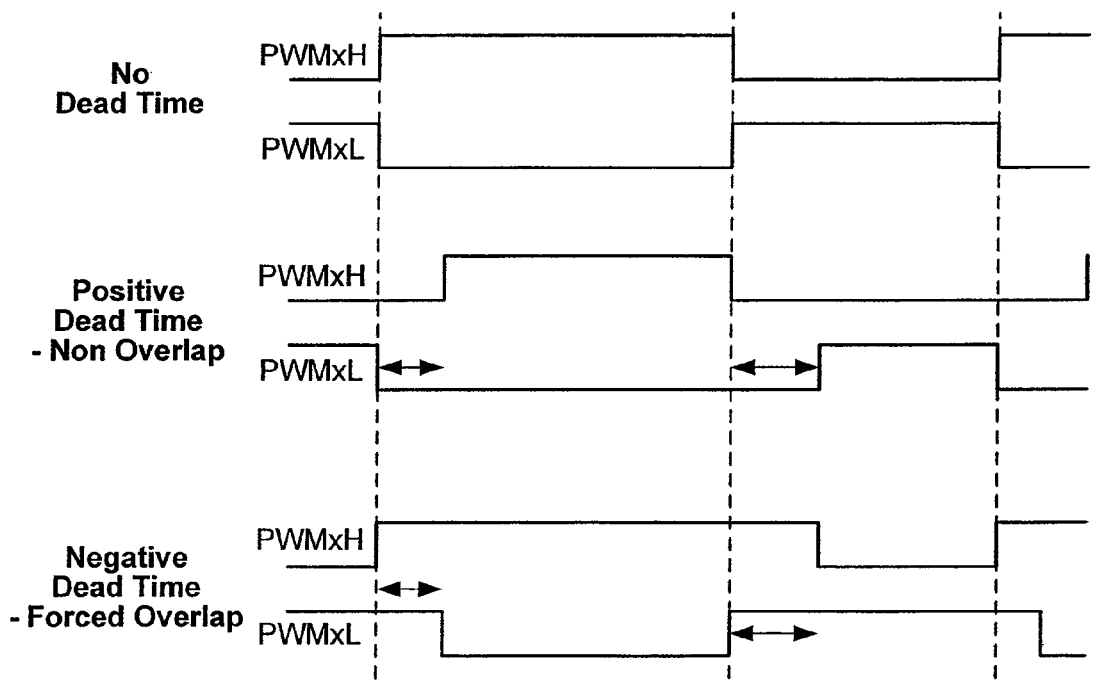
FIG. 2 illustrates timing diagrams of various PWM signal dead time formats.

According to the exemplary embodiments of the present invention, the PWM module 1304 has the ability to insert time periods of no active PWM (dead-time) between the assertion of complementary PWM signals. This forced non-overlap time is called positive dead-time. The PWM module 1304 also has the ability to insert negative dead time which is the forced overlap of PWM signals. These dead time waveform formats are illustrated in FIG. 2.

Figure 10:
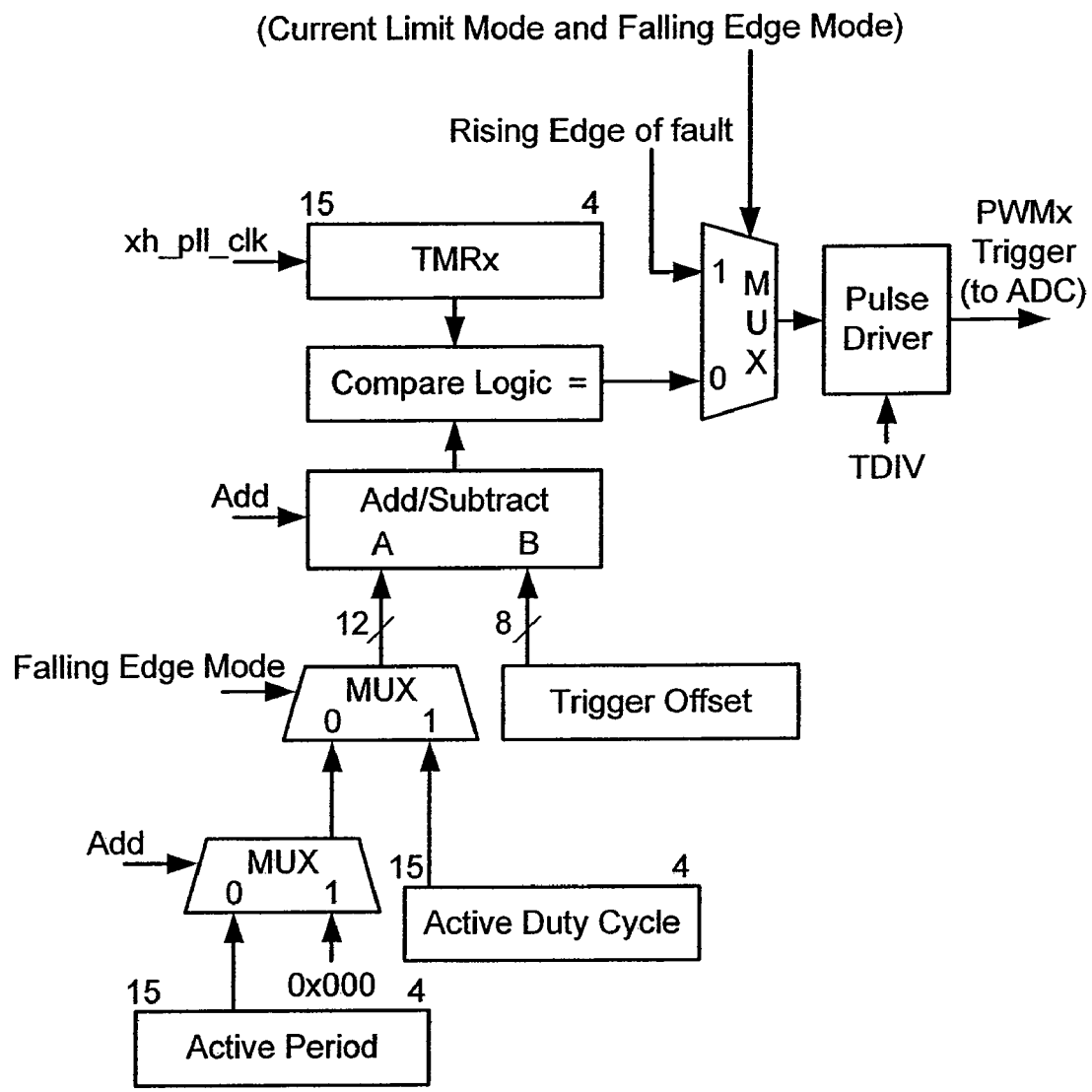
FIG. 10 illustrates a schematic block diagram of a specific exemplary embodiment of a triggering circuit for an analog-to-digital converter.

The PWM generator module also has a unique capability to generate trigger signals that are precisely timed relative to the rise and fall of the PWM signal for purposes of commanding an analog-to-digital converter (ADC) module adapted for taking samples and converting analog voltage and current measurements to digital values for use by the digital processor. This feature is illustrated in FIG. 10.

Figure 11:
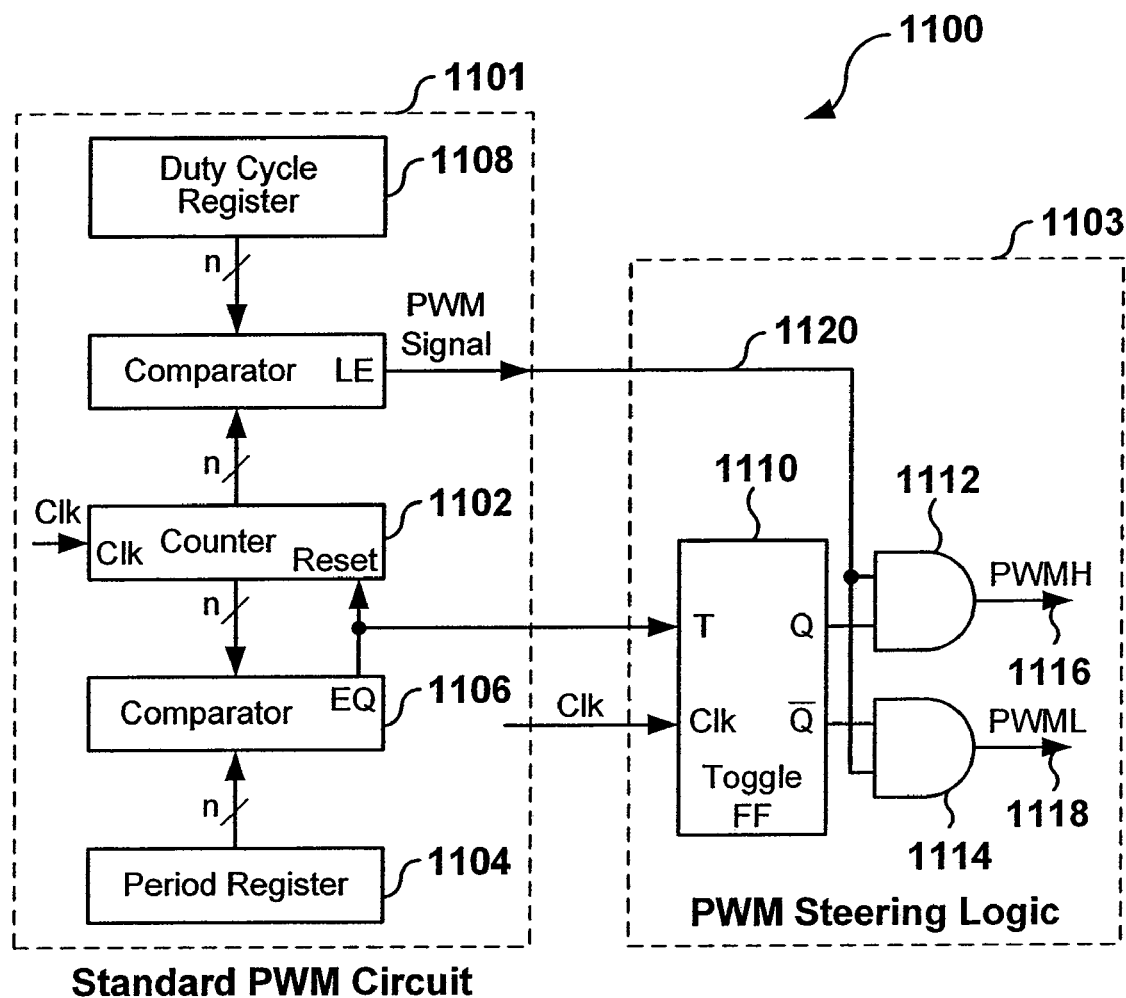
FIG. 11 illustrates a schematic block diagram of a specific exemplary embodiment of a circuit for generating push-pull mode PWM signals.

Referring to FIG. 11, depicted is a schematic block diagram of a circuit for generating push-pull mode PWM signals and that implements PWM steering to provide the Push-Pull PWM outputs. Typically a timer/counter 1102 counts up from zero until it reaches a value specified by a period register 1104 as determined by a comparator 1106. The period register 1104 contains a user specified value which represents the maximum counter value that determines the PWM period. When the timer/counter 1102 matches the value in the period register 1104, the timer/counter 1102 is cleared by a reset signal from the comparator 1106, and the cycle repeats. A duty cycle register 1108 stores the user specified duty cycle value. A PWM output signal 1120 is asserted (driven high) whenever the timer/counter 1102 value is less than the duty cycle value stored in the duty cycle register 1108, and when the timer/counter value 1102 is greater than or equal to the duty cycle value stored in the duty cycle register 1108, the PWM output signal 1120 is de-asserted (driven low). The push-pull mode PWM signals PWMH 1116 and PWML 1118 may be generated with a toggle flip-flop 1110 and AND gates 1112 and 1114, respectively.

According to exemplary specific embodiments of the present invention, the PWM module 1304 has circuitry that enables the generation of PWM signals that may be offset relative to each other in time (phase offset PWM is also known as phase shifted PWM). Two different specific exemplary embodiments are also disclosed herein that provide variable synchronization among the PWM generators. The first specific exemplary embodiment is illustrated in FIG. 3, and the second specific exemplary embodiment is illustrated in FIG. 4.

Figure 3:
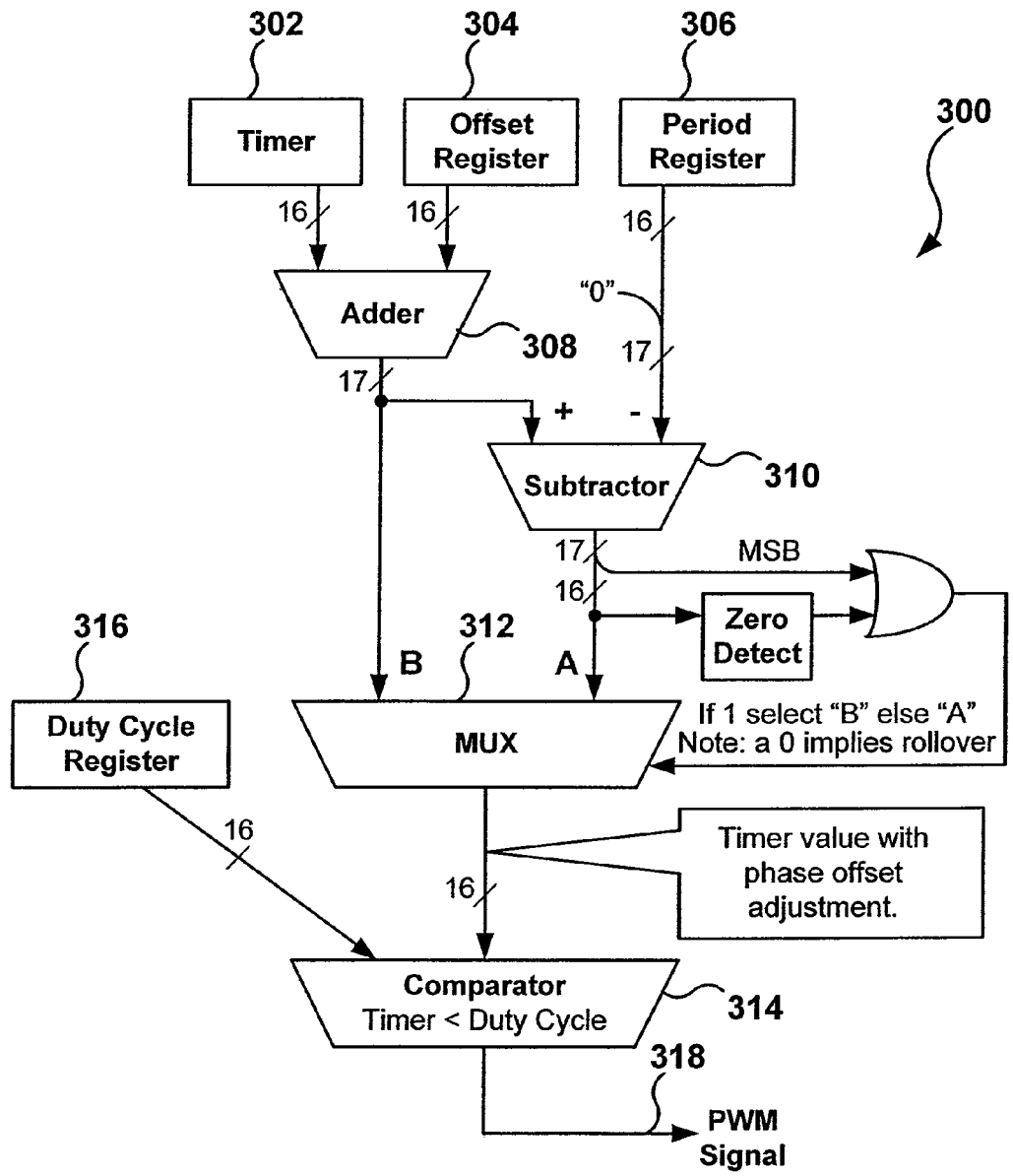
FIG. 3 illustrates a schematic block diagram of a specific exemplary embodiment of an adder-subtractor for generating phase offset PWM.

Referring to FIG. 3, depicted is a schematic block diagram of an adder-subtractor for generating phase offset PWM. The adder-subtractor, generally represented by the numeral 300, has the ability to synchronize while being able to phase shift (offset) a PWM signal relative to other PWM signals. The adder/subtractor 300 comprises a common timer/counter 302 that is shared by all of the existing PWM generator modules.

An offset register 304 (unique to each PWM generator) stores the user specified phase offset value. The period register 306 (shared by all of the PWM generators) stores the user specified period value. A binary adder 308 adds the current timer/counter value to the offset value. The resultant sum represents the offset time base for that particular PWM generator module. The summation of the timer/counter 302 and the offset may exceed the value of the period register 306 (which is not allowed to occur). To prevent a summation from exceeding the period value, a subtractor 310 subtracts the period value from the offset summation. This subtraction is similar to a timer/counter "roll-over." A multiplexer (MUX) 312 selects either the timer/counter 302 plus offset summation value or the timer/counter 302 plus offset minus period value. If the subtractor value is negative (as indicated by the most significant bit) or equal to zero, (indicated by the subtractor bits [15:0] being zero) then the adder value is still less than the period so that the adder value is chosen by the MUX 312. If the subtractor value is positive (MSB is zero) then the subtractor value is selected by the MUX 312. The output of the MUX 312 represents the phase offset time base to be used by the PWM generator. The MUX 312 output is compared in a comparator 314 to the duty cycle value in the duty cycle register 316 to generate the PWM output signal 318. Using the sign of the subtractor 310 (MSB) to perform the selection process between the adder 308 output and the subtractor 310 output saves the "cost" of a comparator that might typically be used to detect the situations where the timer/counter value plus offset value exceeds the period value.

Figure 4:
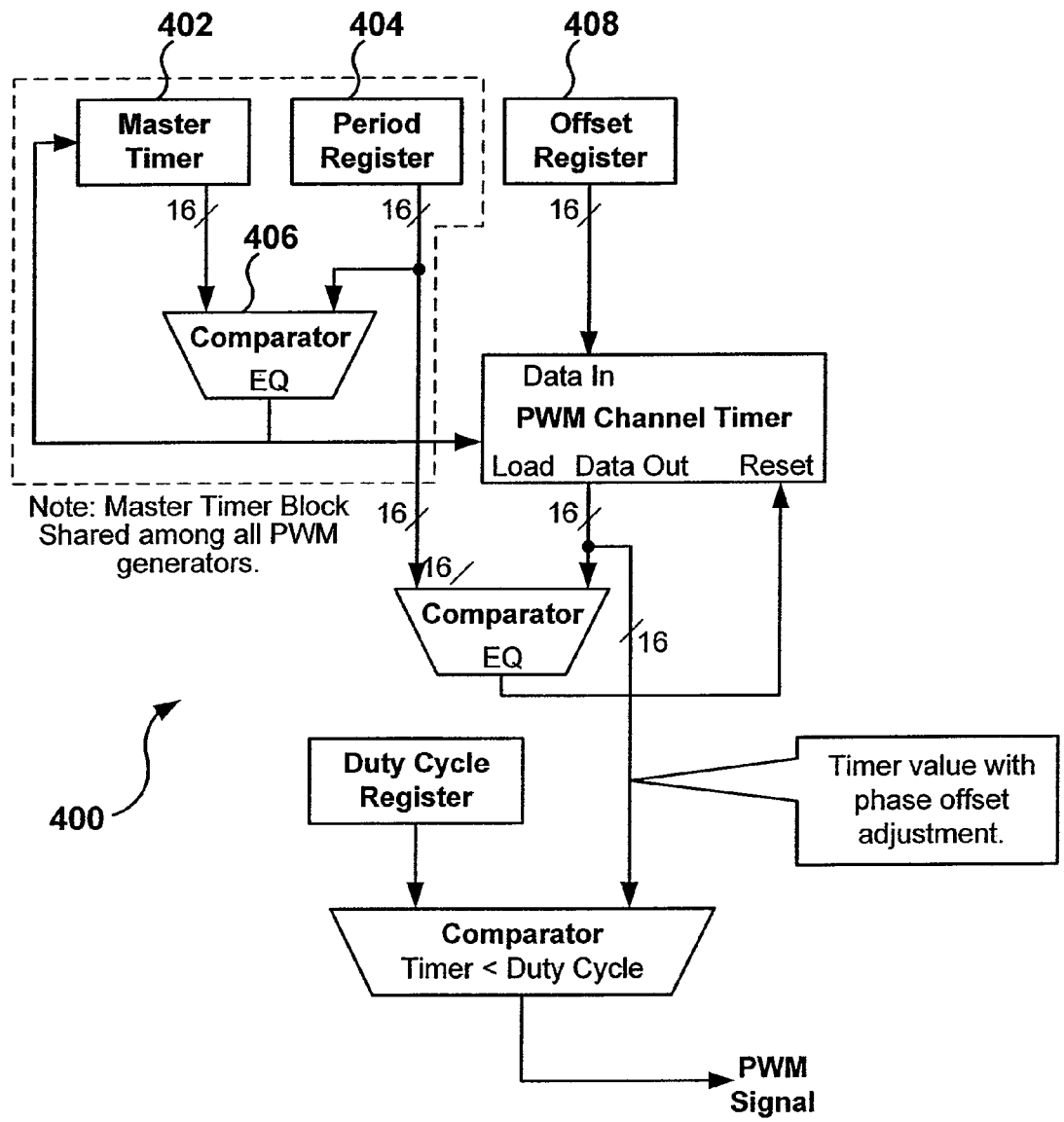
FIG. 4 illustrates a schematic block diagram of a specific exemplary embodiment of a multiple counter for generating phase offset PWM.

Referring to FIG. 4, depicted is a schematic block diagram of a multiple counter for generating phase offset PWM. The multiple counter 400 comprises a common master timer/counter 402, a period register 404, and a comparator module 406. The multiple counter 400 is shared among all of the PWM generators. The multiple counter 400 starts counting upward from zero until its timer/counter value equals the period register 404 value. When the master timer/counter value matches the period value, the master/timer counter 402 is reset to zero by the comparator 406, and the process repeats. The master timer/counter 402 provides synchronization information for the individual timer/counters in each PWM generator.

The individual timer/counters in each PWM generator start counting at a value specified by the user in the offset registers 408. Each of these individual timer/counters count upward until they match the value in the master period register 404. When the individual timer/counters equal the period value, they are reset to zero and begin counting upward again. Whenever the master timer/counter 402 equals the period value in the period register 404, the individual timer/counters are loaded with their respective offset register values. The output of each individual timer/counter is compared to their respective duty cycle values to create the PWM output signals.

Figure 5:
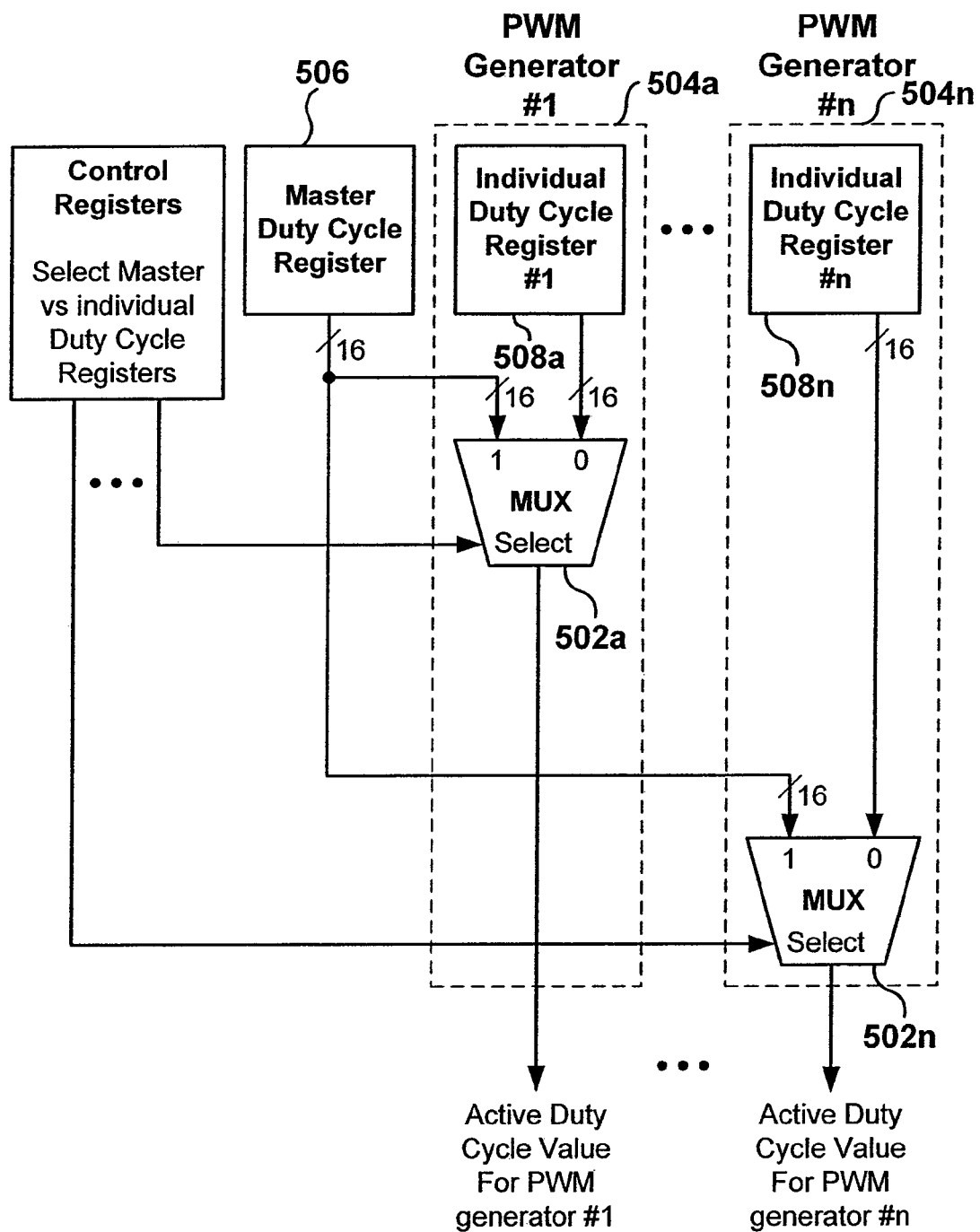
FIG. 5 illustrates a schematic block diagram of a specific exemplary embodiment of a plurality of multiplexers used for simultaneously updating multiple PWM duty-cycle values.

Referring to FIG. 5, depicted is a schematic block diagram of a plurality of multiplexers 502a-502n used for simultaneously updating multiple PWM duty-cycle values. The PWM module 1304, according to exemplary specific embodiments of the present invention, has the ability to reduce the workload of a digital processor (not shown) by permitting multiple PWM generators 504a-504n to share a common master duty cycle register 506 instead of requiring that each of the PWM generators duty cycle registers 508a-508n be updated independently.

FIG. 6 illustrates a unique method to implement high speed timer/counter modules for PWM generation using the generalized method described in the FIG. 3. Timer/counter modules are basically registers with an adder module that increments the timer/counter. The design of large (16 bit) timer/counter modules to operate at very high speed is difficult because of the time required to propagate a "carry" from the least significant bit of the timer/counter to the most significant bit. Another difficult design problem is the "carry" that occurs in the "less than or equal" comparator module that compares the timer/counter output to the duty cycle value. A binary comparator module is similar to an adder module, and suffers from the same carry propagation delay problems. The module illustrated in FIG. 6 is unique. The least significant two bits of the counter 602 are clocked at the high speed rate (4× CLK) while the most significant 14 bits of counter 604 are clocked with a slower (CLK) clock that may be one quarter the frequency of the 4× CLK. Similar modules traditionally consider the small two bit counter a "prescaler." However, a traditional prescaler still requires a "carry" from the prescaler to the main counter. The block diagram module illustrated in FIG. 6 avoids that problem. To avoid the "carry" problem during the counting process and the comparison process, the situations that would result in carries being generated are detected and "pre-processed" prior to the initiating the counting sequence.

For example, if the least significant two bits of the offset value are greater than the least significant two bits of the duty cycle value, then the most significant 14 bits of the offset value are incremented prior to being loaded into the main 14 bit timer/counter. At this point, the two bit counter 602 and the 14 bit counter 604 are totally "decoupled" and may not count in a strictly binary sequence. For example, depending on initial values, the count sequence for the least significant 4 bits of the total counter (604 and 602) could be: 0110 0111 0100 0101 1010 1011 1000 1001 1110 1111 1100 1101 instead of the traditional binary sequence 0000 0001 0010 0011 0100 0101 0110 0111 1000 1001 1010 1011. This "decoupling" of the lower two bits versus the upper 14 bits requires a special mechanism for implementing the duty cycle versus timer/counter comparator module. The upper 14 bits of a comparator is implemented as a standard binary "Less Than or Equal" comparator module. The lower two bits of the comparator check for equality between the two bit counter and the lower two bits of the duty cycle value. Because the lower two bit counter counts in a disconnected fashion from the upper 14 bit counter, a mechanism is required to hold the PWM output asserted (driven high) during the period of time when the upper 14 bits of the duty cycle equal the counter value and the lower 2 bit comparator has not yet detected an equality situation.

Referring to FIGS. 7 and 8, depicted are other implementations for generating very high speed PWM. FIG. 7 illustrates a block diagram of how a fine adjust module 702 may be coupled to a PWM generator 704 to improve the resolution of a standard PWM signal. FIG. 8 illustrates how a delay element 804a in combination with a "OR" gate 802 may be used to stretch a PWM signal 806, and how a delay element 804b in combination with an "AND" gate 808 may be used to shrink a PWM signal 810.

A digital PWM module 1304, such as is illustrated in FIG. 11, may be used to drive the fine adjust module 702. The fine adjust module 702 includes all of the circuitry required to add improved duty cycle resolution, improved phase offset resolution, and improved dead time resolution to the PWM signals outputted by a traditional digital PWM generator module (FIG. 11). All standard digital PWM generator modules use counters and/or adder modules to increment a count value every clock period. Digital counter modules are difficult to design to operate at high frequencies because the count process uses an "adder" module, either implicit in the counter module, or explicitly implemented to create a counter. Adder modules need to propagate a "carry" signal from the least significant bit of the adder output to the most significant bit of the adder output. This carry propagation process requires the carry signal to pass through many levels of logic, thus slowing the process of counting. According to the present invention, implementation of very small shift registers and small multiplexer modules allows operation at high speeds and thus high frequencies.

FIG. 9 illustrates exemplary circuitry for improving the resolution for phase offset, dead-time, and duty cycle of a PWM signal. The phase shift circuitry depicted is a programmable delay element implemented with a shift register and a multiplexer. The select signals to the MUX select the amount of phase shift. The second shift register with its multiplexer and "AND" gate implement the dead-time adjustment logic. The third shift register and multiplexer with the "AND" and "OR" gates stretch and shrink the PWM signal. The stretched PWM signal is used for increasing the duty cycle value, and the shrunk PWM signal represents a reduced duty cycle PWM signal. The PWM signal stretching and shrinking operations is further processed by the two flip-flops that are clocked with, for example, 480 MHz clock signals. This stage provides the third bit of additional duty cycle resolution. The fourth bit of increased duty cycle resolution may be achieved by using 1 nanosecond delay elements with AND and OR gates. At the output, a multiplexer selects either the stretched or shrunk PWM signal depending on whether the true or complement of the PWM signal is to be proved. A final multiplexer (MUX) selects between the generated PWM signal or a predefined state if a system error is detected.

Referring to FIG. 10, depicted is a schematic block diagram of a triggering circuit for an analog-to-digital converter (ADC). Typically, the ADC is triggered so as to measure the voltage and currents in the power supply application module at a point in time when the inductor current is at its maximum. Typically, these measurements will be taken just before or after either the rising or falling edge of the PWM signal. This module adds or subtracts a user specified trigger offset value to/from the duty cycle register value if the user has selected that the trigger occur on the falling edge of the PWM signal. If the user wants the trigger to occur on the rising edge of the PWM signal, either the trigger offset will be subtracted from the PWM period value, or added to 0000 to obtain the point in time just before the end of the PWM cycle, or just after the start of a new PWM cycle. If the PWM generator is in a mode where the PWM signal is modified by an external signal, then the offsets are positive relative to the external PWM control signal.

Figure 1F:
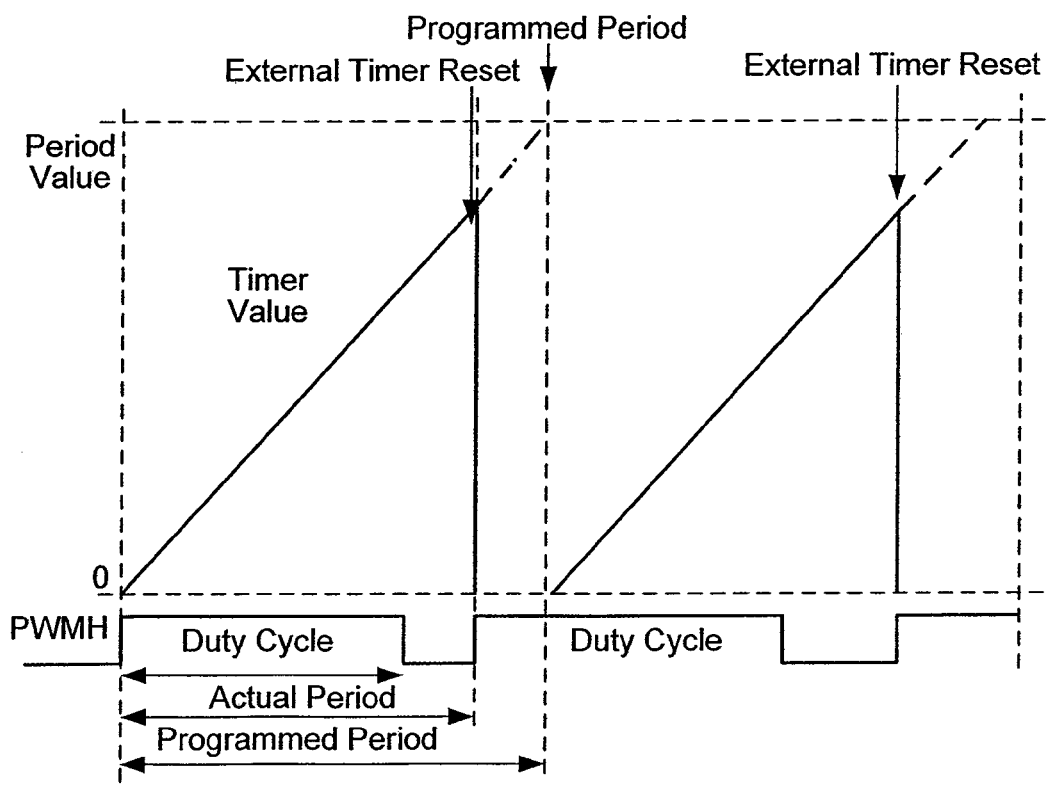
Figure 1G:
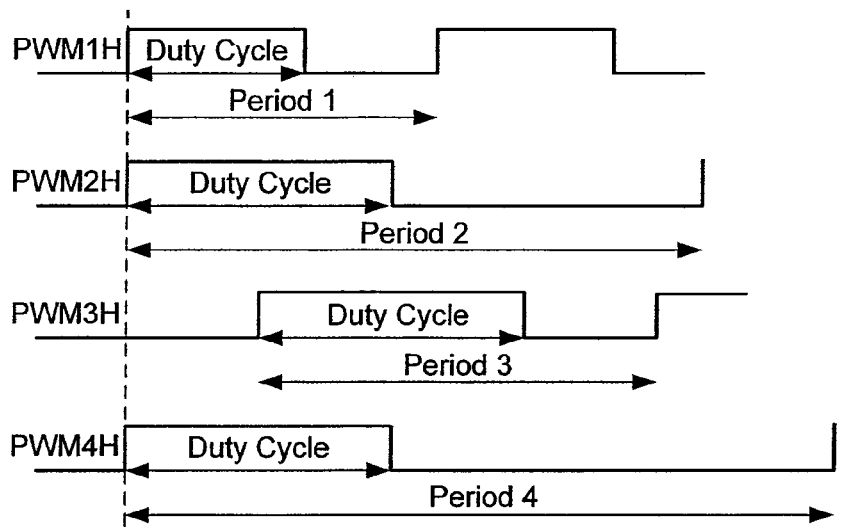
Figure 12:
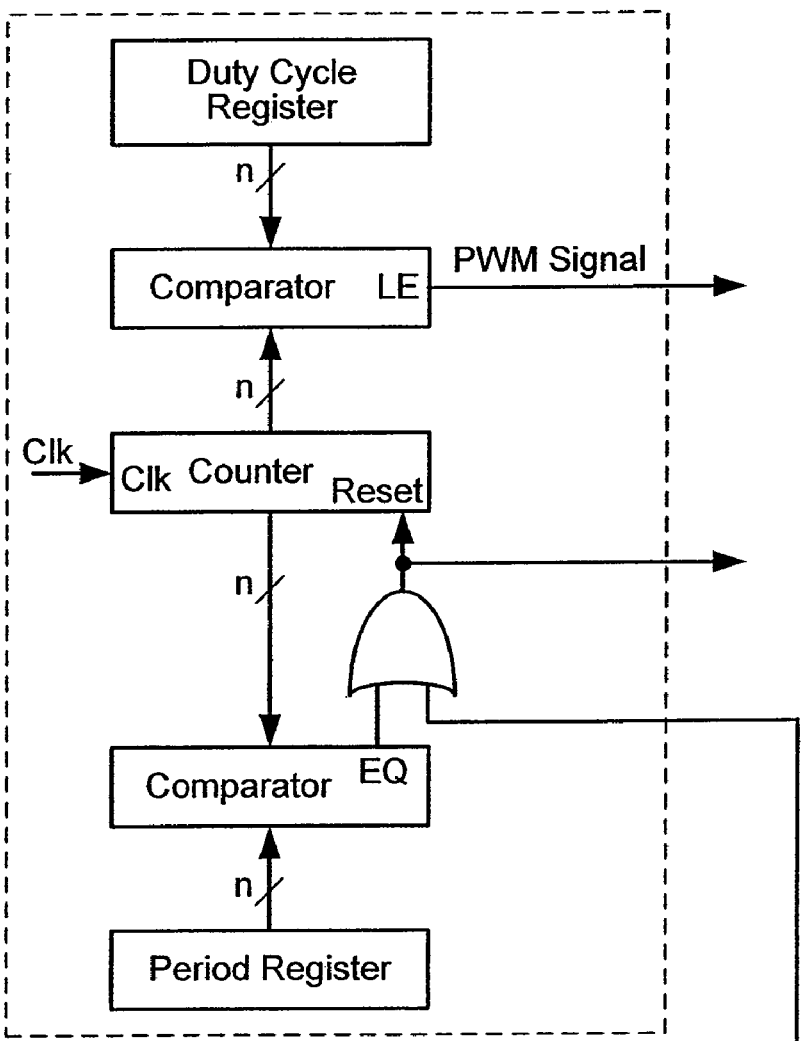
FIG. 12 illustrates a schematic block diagram of a specific exemplary embodiment of a modified circuit of FIG. 11 for supporting current reset PWM mode.
Figure 12:
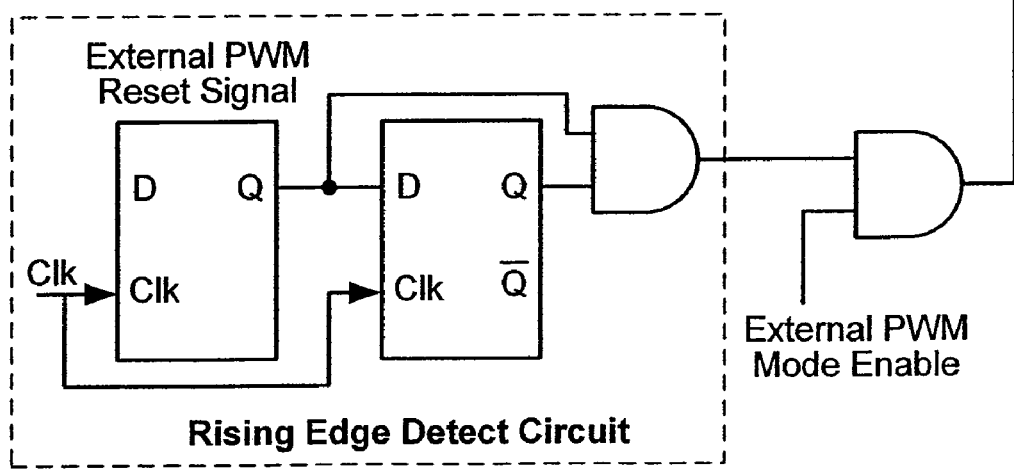

Referring to FIG. 12, depicted is a schematic block diagram of a modified circuit of FIG. 11 for supporting current reset PWM mode so as to support the Current Reset PWM Mode (FIG. 1f). A rising edge detector module monitors the external PWM control signal. If the user has enabled current reset mode, and a rising edge of the signal is detected, then the PWM counter is reset earlier than programmed in the PWM period register.

The present invention has been described in terms of specific exemplary embodiments. In accordance with the present invention, the parameters for a system may be varied, typically with a design engineer specifying and selecting them for the desired application. Further, it is contemplated that other embodiments, which may be devised readily by persons of ordinary skill in the art based on the teachings set forth herein, may be within the scope of the invention, which is defined by the appended claims. The present invention may be modified and practiced in different but equivalent manners that will be apparent to those skilled in the art and having the benefit of the teachings set forth herein.

The invention claimed is:

1. An apparatus for generating push-pull pulse width modulation (PWM) signals, comprising:
   a counter having a clock input, wherein the counter increments a count value for each clock pulse received at the clock input;
   a duty cycle register having a duty cycle value;
   a duty cycle comparator coupled to the duty cycle register and the counter, wherein the duty cycle comparator outputs a PWM signal according to a comparison between the count value and the duty cycle value;
   a period register having a period value;
   a period comparator coupled to the period register and the counter, wherein the period comparator compares the count value to the period value and when the count value is equal to the period value the period comparator causes the counter to reset the count value to zero;
   PWM signal steering logic comprising:
   a toggle flip-flop having a toggle input coupled to the period comparator, and first and second outputs, wherein the second output is the logical inverse of the first output and the first and second outputs reverse logic levels each time the count value is reset to zero,
   a first AND gate comprising a first input coupled to the PWM signal from the duty cycle comparator, a second input coupled to the first output of the toggle flip-flop, and an output comprising a high PWM signal; and
   a second AND gate comprising a first input coupled to the PWM signal from the duty cycle comparator, a second input coupled to the second output of the toggle flip-flop, and an output comprising a low PWM signal; wherein the high PWM signal and the low PWM signal comprise push-pull PWM signals.

2. A method for generating push-pull pulse width modulation (PWM) signals, said method comprising the steps of:
   comparing a count value to a duty cycle value with a duty cycle comparator;
   generating a PWM signal according to the comparison between the count value and the duty cycle value;
   comparing the count value to a period value with a period comparator;
   resetting the count value to zero when the count value is equal to the period value;
   reversing output logic levels from steering logic each time the count value is reset to zero;
   generating a high PWM signal according to the PWM signal when a one of the steering logic outputs is at a first logic level and an other one is at a second logic level; and
   generating a low PWM signal according to the PWM signal when the one of the steering logic outputs is at the second logic level and the other one is at the first logic level, wherein the high PWM signal and the low PWM signal comprise push-pull PWM signal.

* * * * *